United States Patent
Baars et al.

(10) Patent No.: US 8,790,975 B2
(45) Date of Patent: Jul. 29, 2014

(54) SEMICONDUCTOR DEVICE COMPRISING A CAPACITOR FORMED IN THE METALLIZATION SYSTEM BASED ON DUMMY METAL FEATURES

(75) Inventors: Peter Baars, Dresden (DE); Till Schloesser, Dresden (DE); Vivien Schroeder, Ottendorf-Okrilla (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 353 days.

(21) Appl. No.: 13/040,975

(22) Filed: Mar. 4, 2011

(65) Prior Publication Data

US 2012/0223412 A1 Sep. 6, 2012

(51) Int. Cl.
| | | |
|---|---|---|
| *H01L 21/8242* | (2006.01) | |
| *H01L 21/20* | (2006.01) | |
| *H01L 21/28* | (2006.01) | |
| *H01L 21/768* | (2006.01) | |
| *H01L 21/02* | (2006.01) | |
| *H01L 27/108* | (2006.01) | |

(52) U.S. Cl.
CPC .... *H01L 21/76877* (2013.01); *H01L 21/02697* (2013.01); *H01L 21/28* (2013.01); *H01L 27/10852* (2013.01)
USPC ........... 438/243; 438/254; 438/397; 438/239; 257/E21.646

(58) Field of Classification Search
CPC ............... H01L 27/10894; H01L 21/76877; H01L 21/02697; H01L 21/28; H01L 28/60; H01L 27/10852
USPC .......... 438/243, 254, 397, 398, 239; 257/301, 257/304, 309, E21.646
See application file for complete search history.

(56) References Cited

U.S. PATENT DOCUMENTS

| | | | | |
|---|---|---|---|---|
| 5,981,334 | A * | 11/1999 | Chien et al. | 438/253 |
| 6,127,239 | A * | 10/2000 | Jost et al. | 438/397 |
| 7,514,320 | B2 * | 4/2009 | Uchiyama | 438/253 |
| 2003/0124796 | A1 * | 7/2003 | Jeon et al. | 438/253 |
| 2004/0005787 | A1 * | 1/2004 | Day et al. | 438/745 |
| 2008/0128773 | A1 * | 6/2008 | Moll et al. | 257/300 |
| 2009/0026517 | A1 * | 1/2009 | Uchiyama | 257/306 |

* cited by examiner

*Primary Examiner* — Shouxiang Hu
(74) *Attorney, Agent, or Firm* — Amerson Law Firm, PLLC (57) ABSTRACT

When forming capacitive structures in a metallization system, such as in a dynamic RAM area, placeholder metal regions may be formed together with "regular" metal features, thereby achieving a very efficient overall process flow. At a certain manufacturing stage, the metal of the placeholder metal region may be removed on the basis of a wet chemical etch recipe followed by the deposition of the electrode materials and the dielectric materials for the capacitive structure without unduly affecting other portions of the metallization system. In this manner, very high capacitance values may be realized on the basis of a very efficient overall manufacturing flow.

22 Claims, 9 Drawing Sheets

FIG. 2h

SEMICONDUCTOR DEVICE COMPRISING A CAPACITOR FORMED IN THE METALLIZATION SYSTEM BASED ON DUMMY METAL FEATURES

BACKGROUND OF THE INVENTION

1. Field of the Invention

The present disclosure generally relates to the field of fabricating integrated circuits, and, more particularly, to forming capacitors in the metallization system, such as capacitors for dynamic random access memories (DRAM), decoupling capacitors and the like.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance, while, however, increasing dynamic power consumption of the individual transistors. That is, due to the reduced switching time interval, the transient currents upon switching a MOS transistor element from logic low to logic high are significantly increased.

In addition to the large number of transistor elements, a plurality of passive circuit elements, such as capacitors, are typically formed in integrated circuits that are used for a plurality of purposes, such as charge storage for storing information, for decoupling and the like. Decoupling in integrated circuits is an important aspect for reducing the switching noise of the fast switching transistors, since the decoupling capacitor may provide energy at a specific point of the circuitry, for instance at the vicinity of a fast switching transistor, and thus reduce voltage variations caused by the high transient currents which may otherwise unduly affect the logic state represented by the transistor.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices and other sophisticated devices, an increasing amount of storage capacity may be provided on chip with the CPU core, thereby also significantly enhancing the overall performance of modern computer devices. For example, in typical micro-controller designs, different types of storage devices may be incorporated so as to provide an acceptable compromise between die area consumption and information storage density versus operating speed. For example, static RAM memories may be formed on the basis of registers, thereby enabling an access time determined by the switching speed of the corresponding transistors in the registers. Typically, a plurality of transistors may be required to implement a corresponding static RAM cell, thereby significantly reducing the information storage density compared to, for instance, dynamic RAM (DRAM) memories including a storage capacitor in combination with a pass transistor. Thus, a higher information storage density may be achieved with DRAMs, although at a reduced access time compared to static RAMs, which may nevertheless render dynamic RAMs attractive for specific less time critical applications in complex semiconductor devices.

Frequently, the storage capacitors may be formed in the transistor level using a vertical or planar configuration. While the planar architecture may require significant silicon area for obtaining the required capacitance values, the vertical arrangement may necessitate complex patterning regimes for forming the deep trenches of the capacitors.

For these reasons, in other approaches, capacitors may also be implemented in the metallization system of the semiconductor device, i.e., in the metallization layers comprising metal lines and vias, wherein, however, typically, significant modifications of the overall process flow may be required to implement the metal capacitors in the metallization system and to provide the corresponding interconnect structure for connecting the metal capacitors with the circuit elements in the device level, such as transistors and the like. Consequently, also in this case, additional process modules may have to be implemented into the overall process flow, which may thus contribute to additional process complexity.

Figure 1:
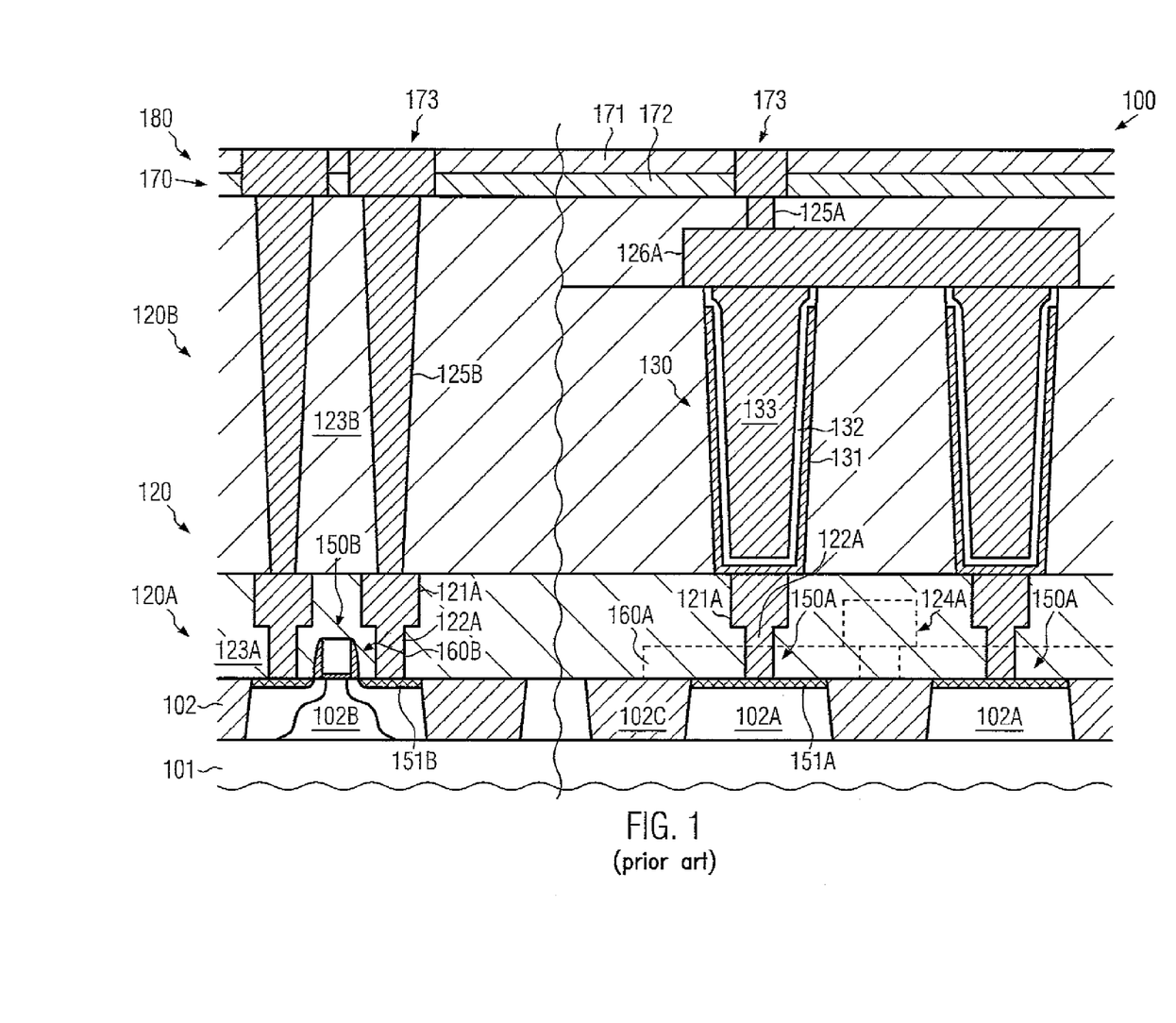
FIG. 1 schematically illustrates a cross-sectional view of a semiconductor device comprising a memory array formed on the basis of capacitors provided in the contact level, thereby reducing performance of non-memory transistors, according to conventional strategies.

In other strategies, the storage capacitors of complex semiconductor devices, which require DRAM arrays in combination with logic circuit portions, an adapted process flow is applied in which the metallization system of the device may be formed for the memory area and the logic portion in a common process sequence, while on the other hand the contact level is used for incorporating the capacitors, which, however, may result in performance loss in the logic circuit portions, as will be described in more detail with reference to FIG. 1.

FIG. 1 schematically illustrates a cross-sectional view of a semiconductor device 100 in a manufacturing stage after incorporating a plurality of storage elements 130 and upon forming a metallization system 180 on the basis of a common process sequence for memory areas and other device areas in which logic circuit portions are to be provided. As shown, the device 100 comprises a substrate 101 which represents any appropriate carrier material for forming thereon a semiconductor layer 102, typically a silicon-based semiconductor layer, which comprises a plurality of semiconductor regions or active regions which are generally to be understood as semiconductor regions in which one or more transistor elements are to be formed. For example, semiconductor regions 102A, which are laterally delineated by respective isolation regions 102C, such as shallow trench isolations and the like, may be provided and may correspond to a plurality of transistors 150A, which may act as switches of a memory array for controlling the charging and discharging of the capacitors 130. On the other hand, an active region 102B is illustrated which represents the active region of one or more transistors 150B, which are to be considered as a part of a logic circuit portion, thereby requiring reduced overall signal propagation delay in this circuit portion. For example, the transistor 150B may comprise a gate electrode structure 160B having any appropriate configuration so as to comply with the overall requirements of performance driven transistor devices. It should be appreciated that in complex semiconductor devices the critical dimensions of circuit components, such as transistors and the like, have reached the deep sub-micron range, wherein overall device performance is significantly affected by the series resistance, the parasitic capacitance and generally the electric performance of any components external to the transistor 150B, such as the performance of a contact level 120 and a metallization system 180. On the other hand, for the transistors 150A, a high packing density is highly desirable in order to increase the overall information density in memory areas of the device 100, while at the same time a certain required capacitance of the capacitors 130 has to be implemented, however, without unduly increasing the lateral size of the capacitors 130 in order to not unduly affect the desired packing density.

Thus, the gate electrode structure 160B may be formed in accordance with required design rules, while corresponding "gate electrode structures" 160A, which also act as word lines of the plurality of transistors 150A when representing a memory array, are provided so as to have a similar configuration in terms of material composition and the like. Furthermore, in view of reducing the overall series resistance, the transistors 150A, 150B include contact regions 151A, 151B, respectively, for instance in the form of a metal silicide which exhibits higher conductivity compared to even highly doped semiconductor materials.

The contact level 120, which is generally to be understood as an "interface" between the semiconductor-based circuit elements 150A, 150B and the metallization system 180, is provided in the form of a first sublevel 120A in which one or more dielectric materials, indicated as material system 123A, are provided so as to enclose and passivate the circuit elements 150A, 150B. Moreover, contact elements 121A and 122A are provided in the dielectric material 123A so as to connect to the contact regions 151A, 151B as required in accordance with the overall circuit layout. Typically, the contact elements 121A, 122A include an appropriate contact metal, such as tungsten, possibly in combination with appropriate barrier materials, such as titanium, titanium nitride and the like. For convenience, any such barrier materials are not shown in FIG. 1. Furthermore, the contact level 120 comprises a second contact sublevel 120B comprising an appropriate dielectric material or materials, indicated as 123B. For example, the capacitors 130 are embedded in the dielectric material 123B and may have an appropriate configuration, for instance comprising a first electrode material 131 that is in contact with the respective contact elements 121A, followed by a dielectric material 132 which acts as the capacitor dielectric and which may be provided in the form of any appropriate dielectric material, such as conventional dielectric materials, high-k dielectric materials and the like. It should be appreciated that a high-k dielectric material is generally to be understood as a dielectric material having a dielectric constant of 10.0 and higher. Furthermore, a second electrode material 133 is provided in the capacitors 130 and is separated from the first electrode material 131 by the dielectric layer 132. Furthermore, a common electrode contact region or electrode "plate" 126A is formed above the capacitors 130, thereby connecting the electrode materials 133 of the various capacitors 130 so as to form a common electrode for a plurality of the capacitors 130. Furthermore, a contact element 125A is formed so as to connect to the common electrode 126A on the one side, and to the metallization system 180 on the other side.

Furthermore, the contact sublevel 120B comprises contact elements 125B formed so as to connect to the respective contact elements 122A and to connect to the metallization system 180. It should be appreciated that the metallization system 180 typically comprises a plurality of metallization layers, wherein, for convenience, the very first metallization layer 170 is illustrated in FIG. 1. The metallization layer 170 typically comprises a dielectric material 171 in combination with an etch stop material 172, wherein, in sophisticated applications, the dielectric material 171 may comprise a low-k dielectric material, i.e., a dielectric material having a dielectric constant of 3.0 and less, in order to reduce the parasitic capacitance in the metallization layer 170. On the other hand, the dielectric material 171 may provide superior etch stop capabilities, mechanical integrity and, if required, superior confinement of highly conductive metals such as copper and the like. For example, metal lines or generally metal regions 173 formed in the metallization layer 170 may comprise a metal of superior conductivity, wherein, as indicated before, in sophisticated applications, a highly conductive material such as copper is used, while in other cases aluminum and the like is frequently implemented, depending on the overall device requirements. Consequently, the contact elements 125B have a height that is substantially determined by the requirements to be applied for forming the capacitors 130, wherein, in sophisticated applications, a thickness of the sublevel 120B may be several hundred nanometers, which may significantly contribute to the overall series resistance, in particular when the contact level 120 is formed on the basis of well-established contact materials, such as tungsten, which may exhibit a significantly lower conductivity compared to highly conductive metals, such as copper.

The semiconductor device 100 as shown in FIG. 1 may be formed on the basis of the following process strategy. First, the semiconductor regions or active regions 102A, 102B are formed by incorporating the isolation regions 102C and incorporating an appropriate dopant profile in the various regions so as to comply with the required transistor characteristics for the devices 150A, 150B. Thereafter, the gate electrode structures 160B, 160A, i.e., the word lines, may be formed on the basis of well-established process strategies, for instance, comprising the deposition or formation of appropriate gate dielectric materials followed by the deposition of gate electrode materials, such as polysilicon and the like, and a patterning process based on sophisticated lithography techniques and anisotropic etch strategies. If required, at least some process steps may be applied differently for the gate electrode structures 160B on the one side and for the gate electrode structures or generally word lines 160A on the other side. Thereafter, drain and source regions may be formed by ion implantation, epitaxial growth techniques and the like, followed by any anneal processes, thereby completing the basic transistor configuration. Thereafter, the contact regions 151A, 151B are formed on the basis of well-established silicidation techniques, followed by the deposition of the dielectric material or materials 123A. Based on well-established contact techniques, the contact elements 121A, 122A may be formed in a common process sequence for the devices 150A, 150B, while additionally any "buried" contact elements 124A are provided so as to appropriately connect to the transistors 150A (shown in dashed lines), thereby forming bit lines for the memory array formed by the transistors 150A in combination with the word lines or gate electrode structures 160A. Thereafter, a portion of the material 123B may be patterned so as to obtain corresponding openings for the capacitors 130 and possibly for a portion of the contact elements 125B, depending on the overall process strategy. Thereafter, the electrode material 131 may be deposited and recessed by using well-established deposition and patterning processed, followed by the deposition of the dielectric layer 132 and the filling in of the electrode material 133. Next, the contact plate 126A may be provided, for instance as an excess portion of the material 133, depending on the process strategy to be applied, followed by forming the contact element 125A. At least during some of the process steps applied to form the capacitors 130, the contact openings 125B may also be formed, while in other cases a separate process sequence may be applied for forming the contact elements 125B. Consequently, after completing the sublevel 120B, the further processing may be continued commonly for the non-memory devices 150B and the transistors 150A by forming the metallization layer 170. To this end, the materials 172, 171 may be deposited and may be patterned so as to receive appropriate openings, which are then refilled by a desired conductive material, possibly in combination with a barrier material (not shown) when, for instance, copper-based metals are used for the metal regions 173. Thereafter, excess material may be removed and the further processing may be continued by forming a further metallization layer of the system 180, for instance by depositing a corresponding etch stop layer, such as the layer 172.

Consequently, although the conventional process strategy described with reference to the device 100 may allow the fabrication of the metallization system 180, commonly for non-memory areas and memory areas of the device 100, thereby significantly enhancing overall process efficiency compared to process strategies in which different process strategies have to be applied for forming capacitors in the metallization system 180, the resulting device configuration above the performance-driven circuit elements 150B may result in increased signal propagation delay caused by the contact elements 125B.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which capacitors or capacitive structures may be formed in the metallization system without requiring sophisticated patterning strategies and adapted process techniques for incorporating the capacitive structures in the metallization system, for instance above a memory area of a complex semiconductor device. Furthermore, a common contact level configuration may be used with superior electrical performance compared to conventional devices, as, for instance, described above. To this end, one or more metallization layers of the metallization system may be formed commonly for any device areas and may comprise appropriate "placeholder" metal regions, the conductive material of which may be replaced, at least with a dielectric material and an electrode material, substantially without affecting the metal features of other device areas and without requiring highly complex plasma assisted etch processes, for instance in order to etch through the dielectric material of one or more metallization layers. Moreover, during the formation of the one or more metallization layers, the dummy metal regions may be formed with an appropriate configuration so as to comply with the electrical requirements of the capacitive structures to be formed upon replacing the fill material of these placeholder metal regions. For example, in some illustrative embodiments, well-established wet chemical etch recipes may be applied to efficiently remove the conductive material of the placeholder metal regions. Consequently, by selecting an appropriate number of metallization layers, a desired height and thus a desired capacitance may be adjusted without requiring undue lateral increase of the capacitive structures. Furthermore, in some illustrative embodiments disclosed herein, the removal of conductive material may also be applied to any "placeholder" contact elements so that the corresponding capacitive structures may directly connect to contact regions of corresponding transistors, such as transistors of a memory array or any transistors which require an efficient connection to a capacitive structure.

One illustrative method disclosed herein comprises forming one or more metallization layers of a metallization system of a semiconductor device above a memory area formed in and above a semiconductor region, wherein the one or more metallization layers comprise a placeholder metal region. The method further comprises selectively removing conductive material from at least the placeholder metal region so as to form a capacitor cavity in a dielectric material of the metallization system. The method further comprises forming a capacitor in the capacitor cavity.

A further illustrative method disclosed herein relates to forming a capacitive structure of a semiconductor device. The method comprises forming a plurality of metallization layers above a first semiconductor region and a second semiconductor region in a common process sequence, wherein each of the plurality of metallization layers comprises a portion of a placeholder metal region that extends through the plurality of metallization layers above the first semiconductor region. The method further comprises replacing at least a portion of the placeholder metal region with a dielectric material and an electrode material. Moreover, the method comprises forming at least one further metallization layer above the plurality of metallization layers.

One illustrative semiconductor device disclosed herein comprises a first transistor formed in and above a first semiconductor region and comprising a first contact region formed in the first semiconductor region. The semiconductor device further comprises a second transistor formed in and above a second semiconductor region, wherein the second transistor comprises a second contact region formed in the second semiconductor region. The semiconductor device further comprises at least one metallization layer formed above the first and second semiconductor regions, wherein the at least one metallization layer comprises a dielectric layer and an etch stop layer. Moreover, the semiconductor device comprises a capacitive metal-containing region laterally embedded in the dielectric layer and the etch stop layer and formed above the first semiconductor region, wherein the capacitive metal-containing region comprises a first metal layer extending to the first contact region and comprising a second metal layer that is separated from the second contact region and from the first metal layer by a dielectric material. Moreover, the semiconductor device comprises a metal region laterally embedded in the dielectric layer and the etch stop layer and formed above the second semiconductor region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which capacitors or capacitive structures, in some illustrative embodiments used as storage elements of dynamic RAM arrays, while in other embodiments capacitive structures for any other electronic purposes, may be efficiently incorporated into the metallization system of the device without requiring sophisticated patterning strategies for etching through the dielectric material of one or more metallization layers. To this end, a contact level and one or more metallization layers may be formed in a common process sequence for device areas requiring a capacitive structure and other devices areas wherein appropriately sized and positioned metal regions may be implemented, which may subsequently be exposed to an etch chemistry in order to remove at least a significant portion of the conductive material, thereby forming "capacitor cavities," in which the capacitive structures may then be incorporated while efficiently masking the portion of the metallization system formed above other device areas. Consequently, the capacitance of the capacitive structures may be efficiently adjusted during the formation of the metallization layers under consideration by selecting an appropriate lateral size of the placeholder metal region, while additionally the number of involved metallization layers may also enable an efficient adjustment of the finally obtained capacitance value. That is, by appropriately selecting the size and shape of the metal region and corresponding "vias" connecting the various portions of the metal regions in the various metallization layers, in total a certain volume may thus be defined, wherein the corresponding surface area defined by this volume or cavity may substantially determine final capacitance value in combination with a thickness and composition of a capacitor dielectric layer. Consequently, if a certain maximum lateral extension of the placeholder metal regions is given by design requirements, the capacitance may be increased by extending the resulting capacitive structure over a desired number of metallization layers. An efficient removal of the "dummy metal" in the placeholder metal regions may be achieved on the basis of a wet chemical etch chemistry having a high selectivity with respect to the dielectric materials of the metallization layers so that the material removal may be accomplished without significant damage, irrespective of the number of involved metallization layers. In some illustrative embodiments, the capacitor cavity may be formed so as to extend down to a contact region of a semiconductor material, thereby using the entire height of the contact level and the one or more involved metallization layers for forming the capacitive structure. To this end, the corresponding wet chemical etch chemistry may also be efficient in removing a contact material, such as tungsten, while on the other hand the contact region, for instance comprised of a metal silicide, may provide sufficient etch stop capabilities. To this end, etch chemistries are available, for instance from ATMI, which provide high etch rates for etching copper, barrier materials such as tantalum, tantalum nitride, tungsten and the like, while being highly selective with respect to silicon dioxide, a plurality of low-k dielectric materials, silicon nitride and metal silicide such as nickel-containing metal silicides.

With reference to FIGS. 2a-2h, further illustrative embodiments will now be described in more detail, wherein reference may also be made to FIG. 1, if required.

Figure 2A:
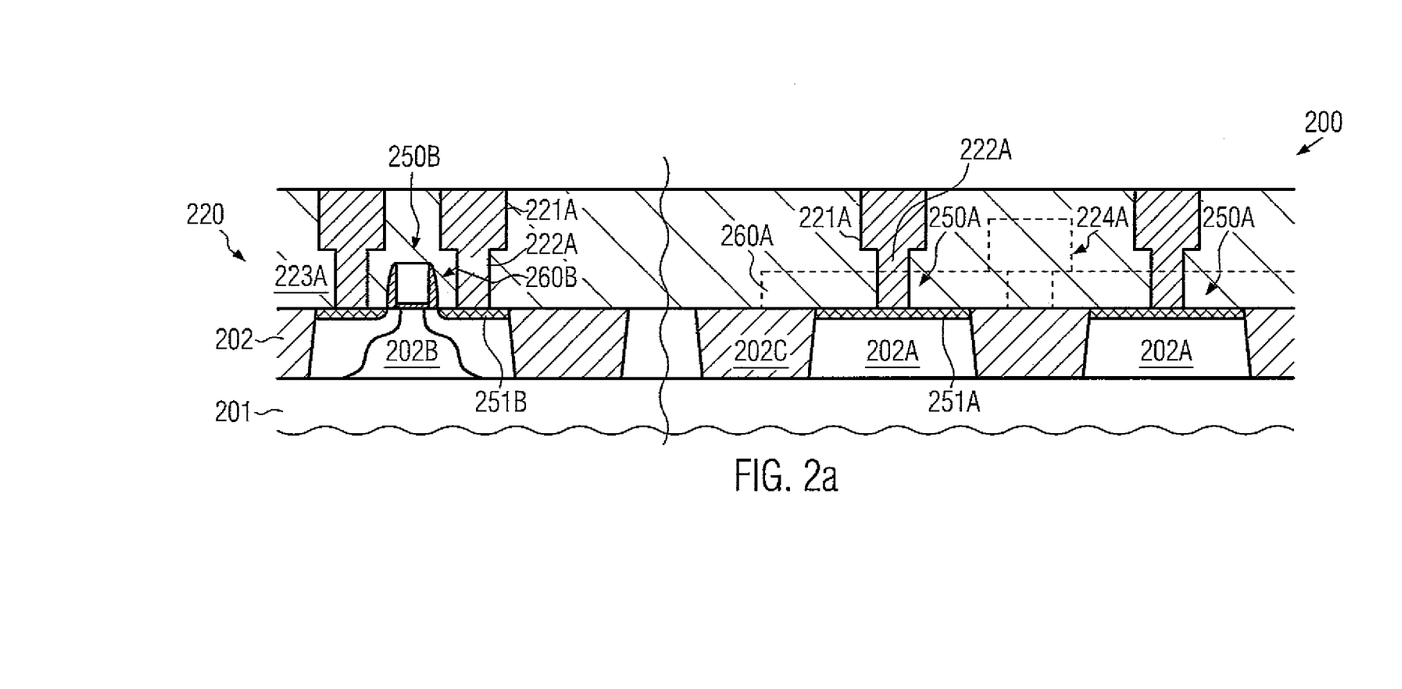
FIGS. 2a-2h schematically illustrate cross-sectional views of a semiconductor device during various manufacturing stages in which a metallization system is formed commonly above transistors requiring a capacitive structure and performance driven transistors by implementing appropriate placeholder metal regions or dummy regions in order to implement therein the capacitive structures, according to illustrative embodiments.

FIG. 2a schematically illustrates a cross-sectional view of a semiconductor device 200, which may comprise a substrate 201 and a semiconductor layer 202. The substrate 201 and the semiconductor layer 202 may form a silicon-on-insulator (SOI) configuration when a buried insulating material is formed directly below the semiconductor layer 202. In other cases, the components 201 and 202 may form a bulk configuration, wherein the semiconductor layer 202 is in direct contact with a crystalline semiconductor material of the substrate 201. It should be appreciated that the semiconductor layer 202 is a continuous semiconductor layer in an initial manufacturing stage but is typically laterally divided into a plurality of semiconductor regions or active regions by means of appropriate isolation structures 202C, such as shallow trench isolations. For convenience, active regions or semiconductor regions 202A are illustrated, which in some illustrative embodiments may represent the active regions of a plurality of transistors 250A, which may be configured so as to act as a plurality of transistors of a memory area, wherein an appropriate configuration may be used so as to obtain an array of individually addressable memory cells (not shown), as is required for dynamic RAM circuit portions and the like. Consequently, in some illustrative embodiments, the active regions 202A may represent a memory area of the semiconductor layer 202. Furthermore, a plurality of active regions, one of which is indicated as 202B, may represent the active regions of transistors 250B, which may require high performance characteristics, for instance in terms of switching speed, overall series resistance and the like, as is also explained above. Thus, the transistor 250B may comprise a gate electrode structure 260B having any appropriate configuration in terms of material composition, lateral dimensions and the like. Similarly, the transistors 250A may comprise gate electrode structures 260A, which are illustrated in dashed lines, since these gate electrode structures 260A may not actually be visible in the section of FIG. 2a. Moreover, when representing a memory array, the gate electrode structures 260A may act as word lines and may thus extend across a plurality of the active regions 202A, as required by the overall layout of a corresponding memory array. Furthermore, the active regions 202A, 202B may comprise an appropriate dopant profile therein, as required for the overall transistor characteristics, while also contact regions 251A, 251B may be provided so as to reduce the overall series resistance in these devices. For example, the contact regions 251A, 251B may comprise a metal silicide in the form of nickel silicide, nickel/platinum silicide or any other metal silicide. Moreover, in the manufacturing stage shown, a contact level 220 may be provided, for instance in the form of one or more dielectric materials 223A, in which are embedded contact elements 221A, 222A so as to connect to respective contact regions 251A, 251B. Moreover, in some illustrative embodiments, additional contact elements or contact lines 224A may be provided so as to connect to the transistors 250A as required for appropriately controlling accessibility of individual memory cells in accordance with well-established circuit configurations. In this case, the contact lines 224A may be referred to as bit lines. It should be appreciated that, basically, the contact elements 221A, 222A formed above the active regions 202B, 202A, respectively, may basically have the same configuration but may differ in lateral size and shape since, in some illustrative embodiments, the contact elements 221A, 222A formed above the active regions 202A may represent a portion of a placeholder metal region that may extend along one or more metallization layers still to be formed.

The semiconductor device 200 as shown in FIG. 2a may be formed on the basis of any appropriate process strategy, as is also described above with reference to the device 100, when referring to the contact level 120A. Consequently, the contact elements 221A, 222A may be formed in a common manufacturing sequence on the basis of a configuration which results in a desired reduced contact resistivity, in particular for the transistors 250B, since the contact elements 221A may be contacted directly by the very first metallization layer.

Figure 2B:
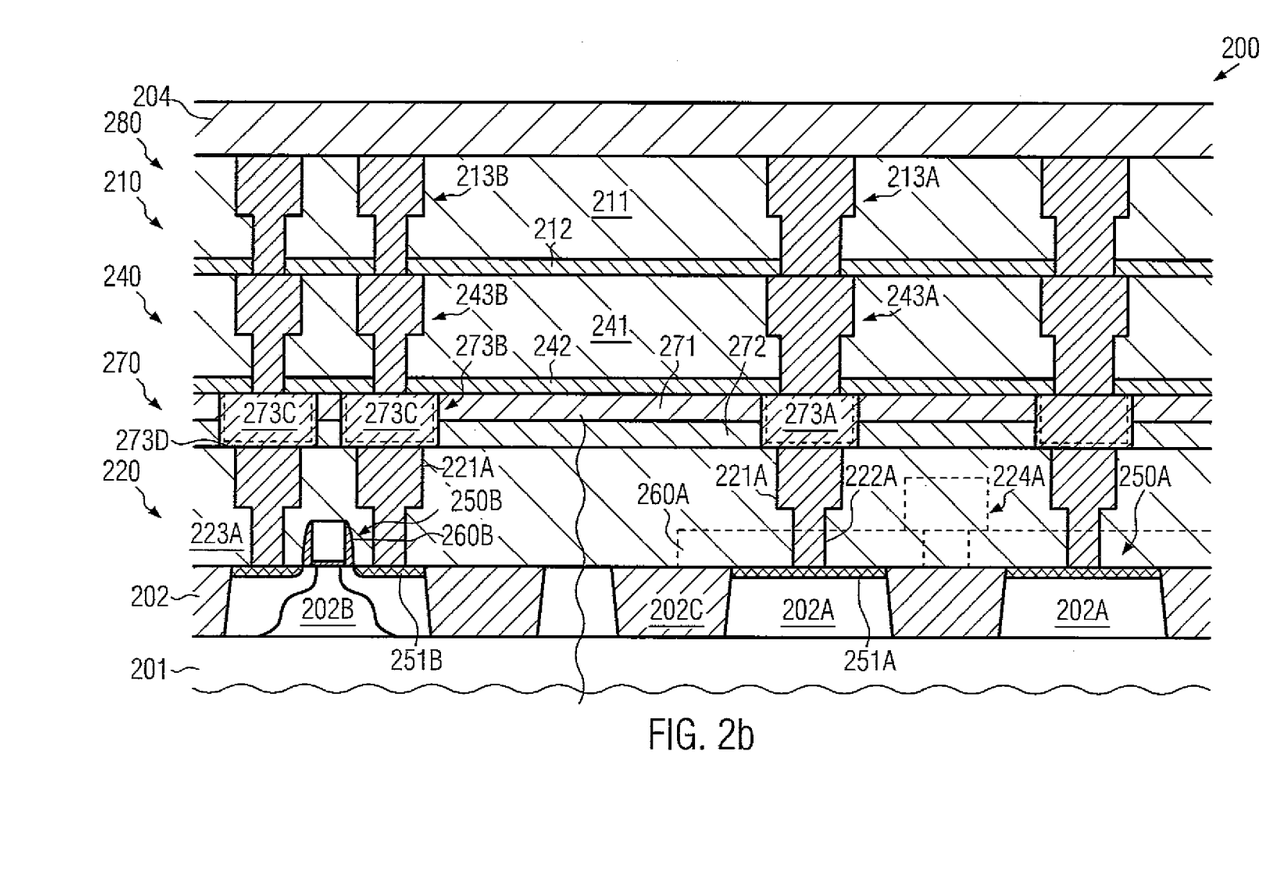

FIG. 2b schematically illustrates the device 200 in a further advanced manufacturing stage. As shown, a portion of a metallization system 280 may be formed above the contact level 220. In the embodiment shown, a first metallization layer 270 may be provided so as to connect to the contact level 220, wherein the metallization layer 270 may comprise a dielectric material 271 in combination with an etch stop material 272, if required in this metallization level, wherein corresponding metal regions 273B may be provided in accordance with the overall circuit layout as required for appropriately electrically connecting the transistor 250B. As shown, the metal regions 273B may comprise, in some illustrative embodiments, a highly conductive core metal 273C, for instance in the form of a copper material, while also a barrier material or material system 273D may be provided, for instance in the form of tantalum, tantalum nitride and the like. It should be appreciated that, in some illustrative embodiments, at least the material 271 may be provided as a material having a dielectric constant of 3.0 and lower, which may be referred to herein as a low-k dielectric material. Similarly, the metallization layer 270 may comprise metal regions 273A, which have basically the same configuration as the metal regions 273B with respect to the material composition, wherein, however, the lateral size thereof may be selected so as to comply with the overall layout configurations of the devices 250A, for instance when representing a memory array. As discussed above, the metal regions 273A may represent a portion of a placeholder metal region that is to be provided in one or more of the metallization layers of the system 280 so as to provide an appropriate surface area for a capacitive structure that is to be formed in the placeholder metal region in a later manufacturing stage.

Furthermore, additional metallization layers 240, 210 may be provided so as to adjust, in combination with the lateral size of corresponding metal regions 243A, 213A, the final capacitance value of a capacitive structure still to be formed. On the other hand, corresponding metal regions 243B, 213B may have any appropriate configuration as required by the circuit layout for connecting the transistors 250B. Furthermore, the layer 240 may comprise an appropriate dielectric material 241, such as a low-k dielectric material in combination with an etch stop layer 242, and similarly the metallization layer 210 may comprise a dielectric material 211 in combination with an etch stop layer 212. Furthermore, a mask layer 204, such as a silicon dioxide layer and the like, may be provided above the metallization layer 210 when this layer is to represent the last metallization layer in which a capacitive structure is to be formed so as to connect to the transistors 250A. It should be appreciated, however, that additional capacitive structures may be formed above the metallization layer 210, which may thus form separate capacitive structures and which may have to be connected to other semiconductor-based circuit elements by means of the lower-lying metallization layers, such as the layers 270, 240, 210.

The metallization system 280 as shown in FIG. 2b may be formed on the basis of any appropriate process strategy, for instance, depositing the respective dielectric materials and patterning the same so as to form corresponding openings, such as trenches and via openings, with appropriate size and position. Similarly, during the corresponding patterning processes, the openings for the various metallization regions 273A, 243A, 213A may be provided so as to enable an efficient removal of the metal contained therein and also to provide the required surface area when forming a capacitive structure as discussed above. For example, in copper-based metallization systems, well-established dual damascene or inlaid techniques may be applied, while, in other cases, any other appropriate process regime may be used. After removing the excess material of the metallization layer 210, for instance by chemical mechanical polishing (CMP), the mask layer 204 may be deposited, for instance by well-established plasma-based chemical vapor deposition (CVD) recipes and the like. The layer 204 may act as a stop layer in a later manufacturing stage, thereby providing superior process control and integrity of the portion of the metallization system 280 formed above the semiconductor region 202B.

Figure 2C:
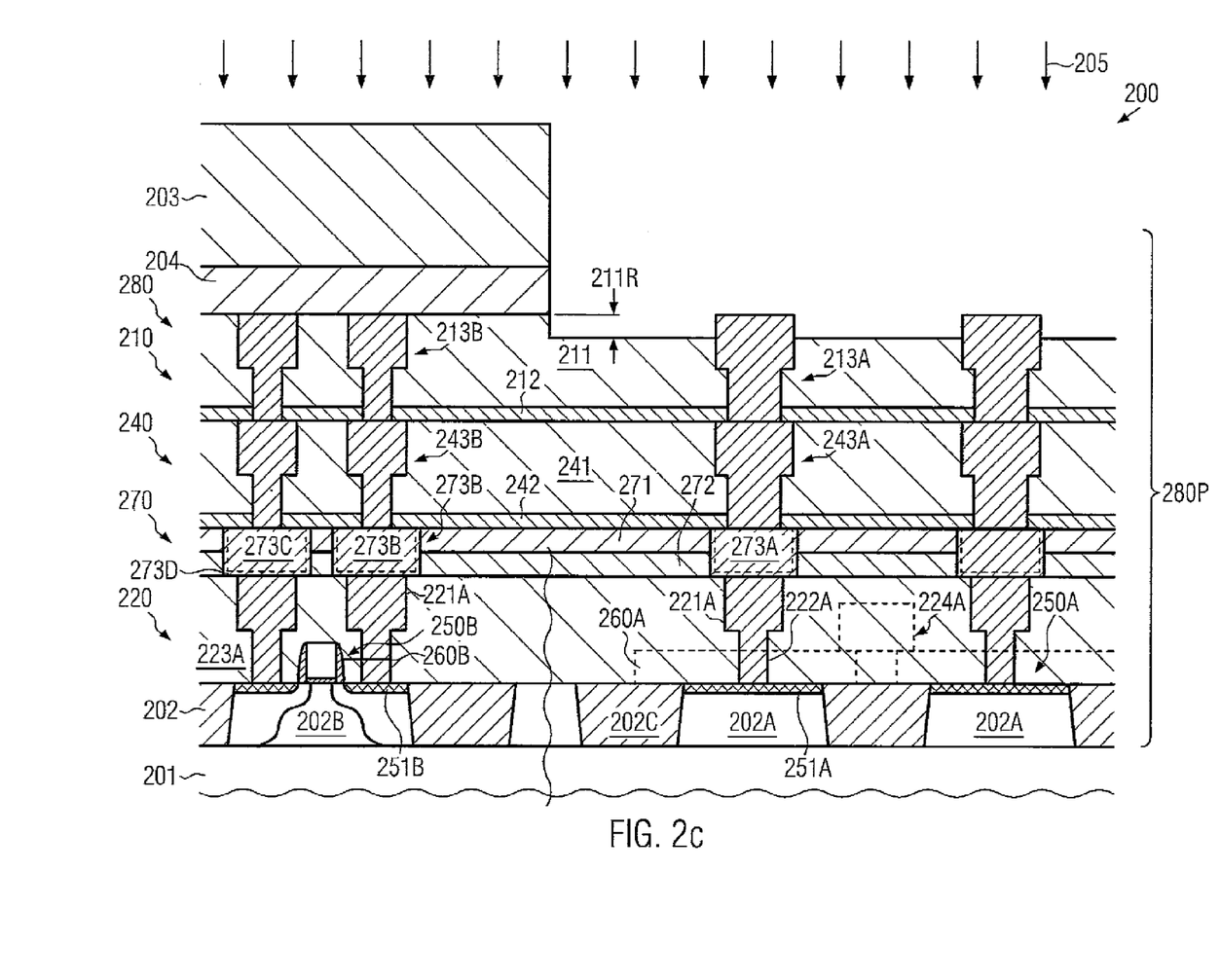

FIG. 2c schematically illustrates the device 200 in a further advanced manufacturing stage in which an etch mask 203 may be provided above the mask layer 204 so as to cover a portion of the metallization system 280 formed above the region 202b while exposing a portion of the metallization system 280 and thus of the layer 204 formed above the active regions 202A. The etch mask 203 may be provided in the form of any appropriate material, such as a resist material and the like. Thereafter, the device 200 may be exposed to a reactive etch atmosphere 205 so as to etch through the mask layer 204 and also etch into the dielectric material 211, thereby forming a recess 211R therein. To this end, any well-established etch recipe may be applied. It should be appreciated that the recess 211R may basically define a thickness of a common electrode to be formed in a later manufacturing stage. Consequently, after completing the etch process 205 and removing the etch mask 203, if required, the metal regions 213A may be exposed. It should be appreciated that the metal regions 213A, which connect to the metal regions 243A and which in turn connect to the metal regions 273A, may be considered as a vertically stacked placeholder metal region 280P, wherein the height and thus the size of this placeholder metal region may depend on the number of selected metallization layers to be used for forming a capacitive structure. Moreover, in the embodiment shown, also the contact elements 221A and 222A may represent a part of the placeholder metal region 280P, while, in other illustrative embodiments (not shown), at least one of the contact elements 221A, 222A may be preserved upon removing conductive material from the region 280P in a subsequent manufacturing stage.

Figure 2D:
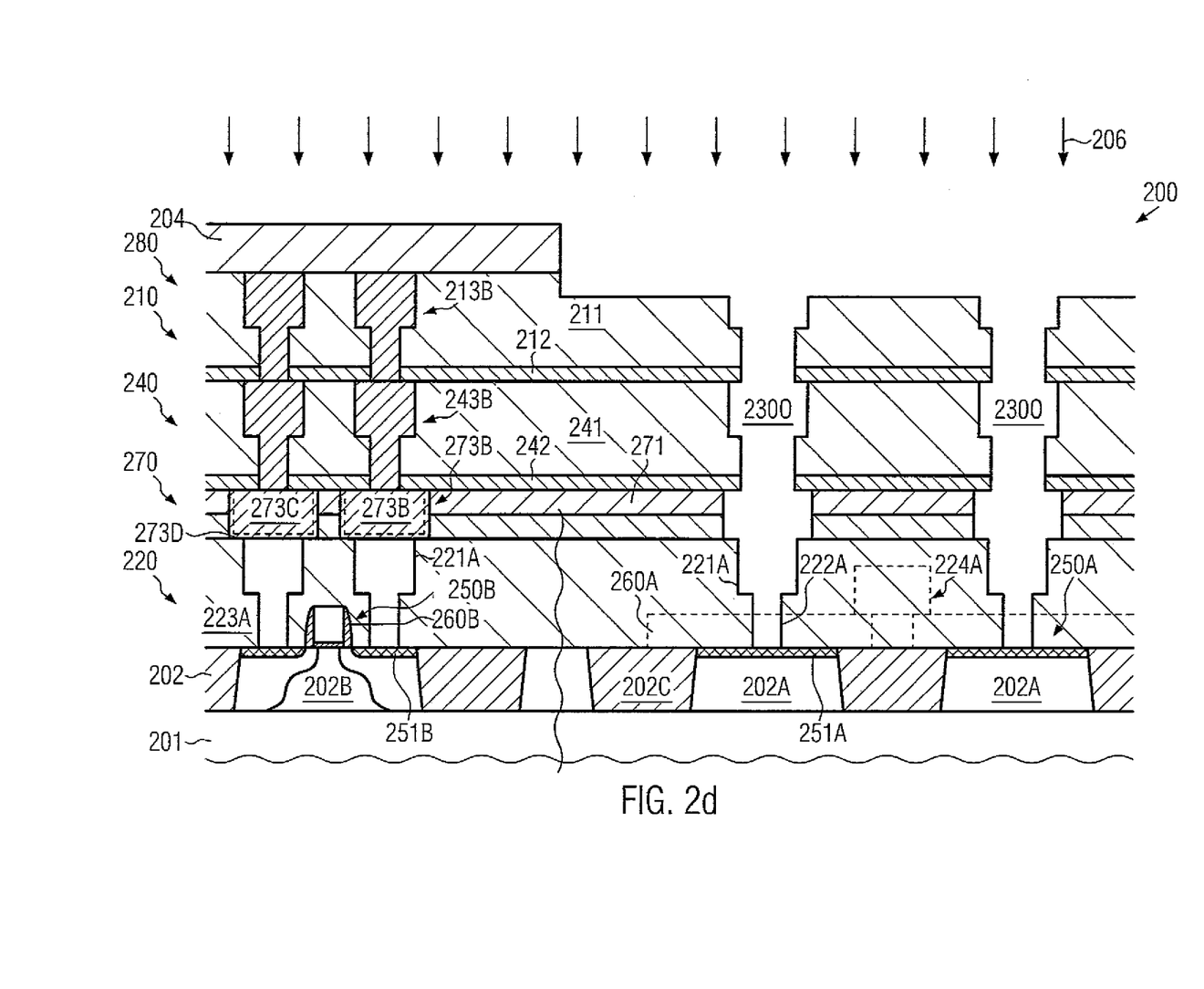

FIG. 2*d* schematically illustrates the device 200 when exposed to a reactive etch ambient 206 which, in some illustrative embodiments, may be applied on the basis of wet chemical etch recipes having a high etch rate with respect to the conductive material used in the metallization system 280, while on the other hand having a moderately high selectivity with respect to the mask layer 204 and to the dielectric materials of the metallization system 280. To this end, commercially available etch chemistries may be applied, as indicated above. Consequently, during the etch process 206 by removing the conductive material of the exposed metal regions corresponding capacitor cavities 230O may be formed, which may extend to a depth that depends on the etch characteristics of the chemistry used in the process 206. For example, as discussed above, the etch process 206 may efficiently remove the metals used in the metallization system 280 and may also efficiently remove the conductive contact material used in the contact level 220, thereby finally exposing the contact regions 251A. It should be appreciated that in embodiments shown in FIG. 2*d*, also any conductive barrier material or material systems may be removed when forming the cavities 230O. In other illustrative embodiments (not shown), a barrier material system may be applied wherein at least one layer may have a high etch resistivity during the process 206, thereby maintaining a corresponding barrier layer on sidewalls of the resulting cavities 230O. In order to not unduly avoid the etching through the various metallization layers 210, 240, the corresponding barrier material may be efficiently removed upon forming the metallization layer, for instance by applying a sputter etch process so as to efficiently remove any barrier material from the bottom of via openings prior to filling in a highly conductive core metal, such as the metal 273C (FIG. 2*b*), which may thus result in a reliable coverage of any sidewalls while efficiently removing the barrier material from the bottom of the corresponding vias, i.e., at the interface at which the metal regions connect to the metal regions of the overlying metallization layer. For example, a corresponding removal of a barrier material from the bottom of a via opening may be accomplished in an efficient manner by, for instance, increasing the lateral width of the corresponding vias in the portion of the metallization layer formed above devices 250A, thereby providing uniform etch characteristics upon forming the cavities 230O. In this manner, the etch process may be reliably stopped on a corresponding barrier material layer formed on the contact elements 221A when forming the cavities 230O.

Figure 2E:
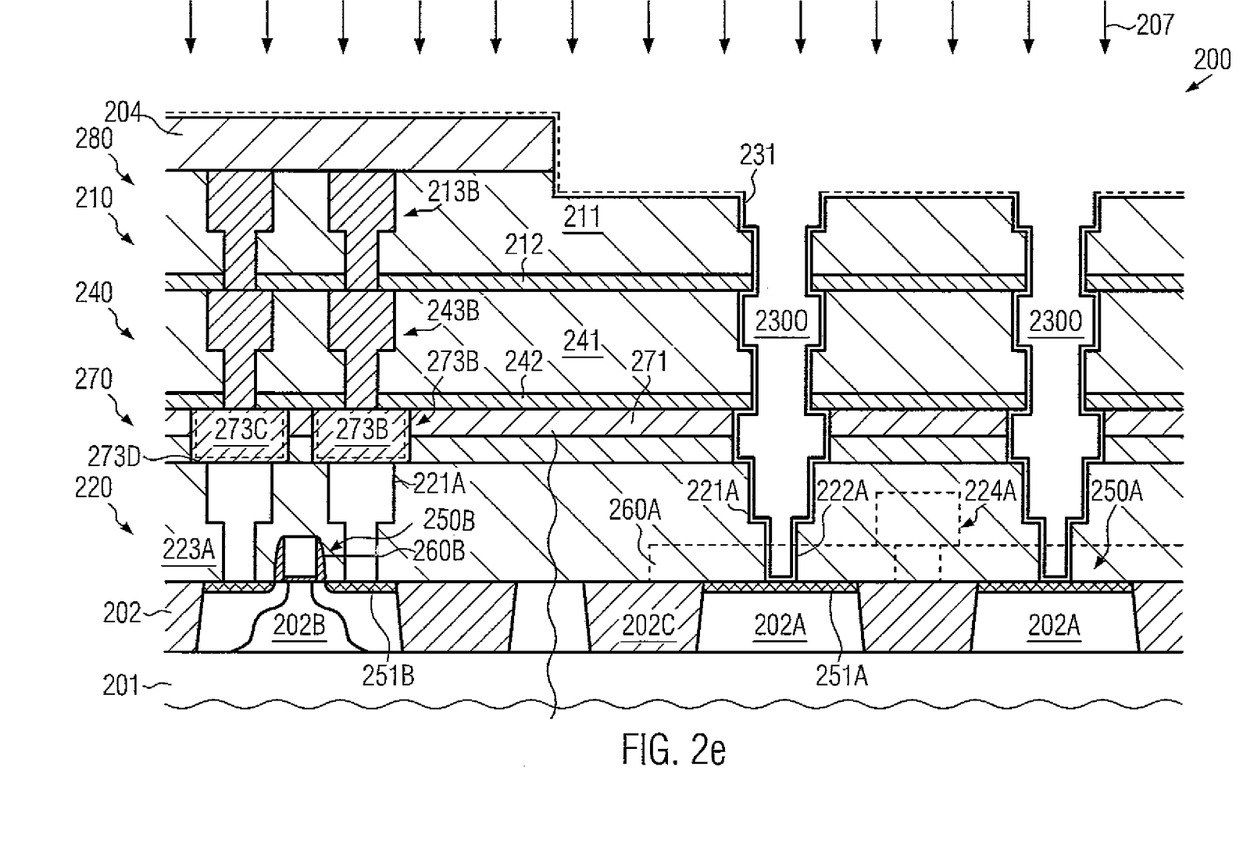

FIG. 2*e* schematically illustrates the device 200 in a further advanced manufacturing stage. As shown, a first electrode material 231 may be deposited, for instance, by any appropriate deposition technique, such as highly controllable and conformal deposition processes in the form of atomic layer deposition (ALD) techniques, which may provide a self-limiting deposition behavior and for which efficient deposition recipes are available for a plurality of conductive materials, such as tantalum nitride and the like. Consequently, the exposed surface areas of the cavities 230O may be reliably covered by the electrode material 231. Thereafter, a process sequence 207 may be applied, in which the material 231 may be appropriately removed or recessed, which may be accomplished, for instance, by filling the cavities 230O with an appropriate fill material and recessing the fill material followed by an etch process for removing an exposed portion of the material 231. Thereafter, any sacrificial material may be efficiently removed by well-established process techniques.

Figure 2F:
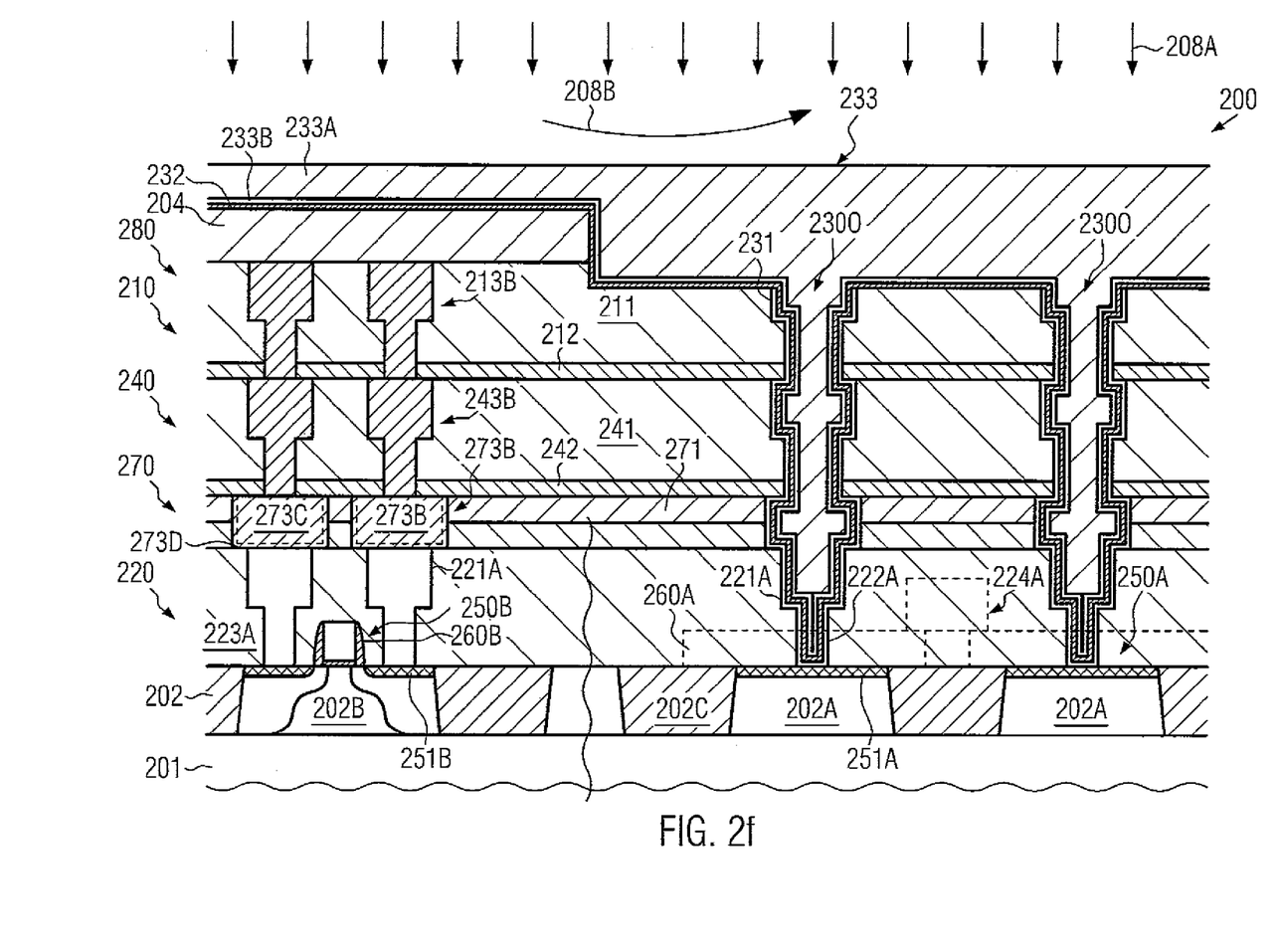

FIG. 2*f* schematically illustrates the device 200 in a further advanced stage in which, in a first process sequence 208A, a dielectric material 232 may be deposited in a highly conformal manner, for instance on the basis of well-established CVD-based techniques, such as ALD, in order to form the dielectric material 232 with an appropriate layer thickness reliably on the previously formed electrode material 231. For example, the dielectric material 232 may be provided in the form of a high-k dielectric material so as to reduce leakage currents while nevertheless providing a high capacitance value. For example, a plurality of metal oxides and silicates may be used as high-k dielectric materials, such as hafnium oxide, zirconium oxide and the like. For a plurality of these high-k dielectric materials, corresponding highly conformal deposition techniques are well established in the art. Thereafter, in a second process step of the sequence 208A, an appropriate electrode material 233 may be deposited, for instance in the form of a conductive barrier material, such as tantalum nitride, as indicated by 233B, followed by a highly conductive metal 233A, such as tungsten and the like. To this end, well-established deposition strategies may be applied as are also typically used when forming the contact levels of sophisticated semiconductor devices. For example, the tantalum nitride material may be deposited on the basis of ALD and the like while the tungsten material may be deposited by using CVD techniques. Thereafter, a material removal process 208B may be applied, for instance comprising a CMP process, in order to remove an excess portion of the electrode material 233. During the removal process 208B, the mask layer 204 may act as an efficient stop layer or control layer, thereby providing superior process uniformity and robustness, while at the same time preserving mechanical integrity of the metallization system 280.

Figure 2G:
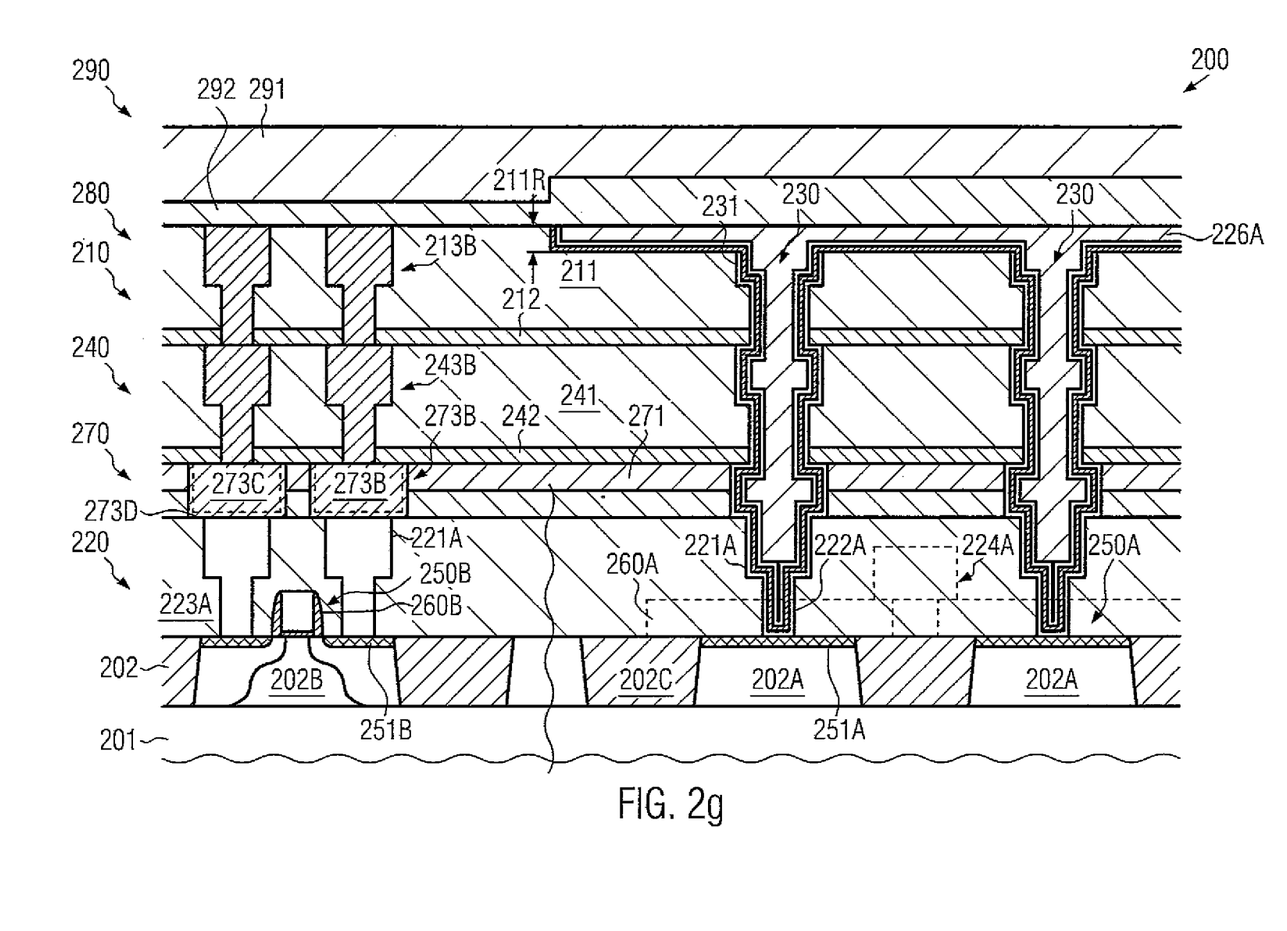

FIG. 2*g* schematically illustrates the device 200 in a further advanced manufacturing stage. As shown, capacitors 230 are provided and extend through the metallization layers 210 . . . 270 and through the contact level 220 so as to directly connect to the contact regions 251A. Furthermore, due to the previously formed recess 211R in the dielectric material 211, a common electrode plate 226A may be formed so as to connect the capacitors 230. Furthermore, in this manufacturing stage, the dielectric material 291 of a further metallization layer 290 may be formed above the metallization layer 210 and above the capacitors 230, wherein a corresponding etch stop layer 292 may also be provided, as is also discussed with reference to the metallization layers 210, 240 and 270. To this end, any appropriate deposition techniques may be applied. Thereafter, sophisticated lithography and patterning strategies may be applied in order to form appropriate openings in the dielectric materials 291, 292 so as to define the size, position and shape of corresponding metal regions to be formed in the metallization layer 290.

Figure 2H:
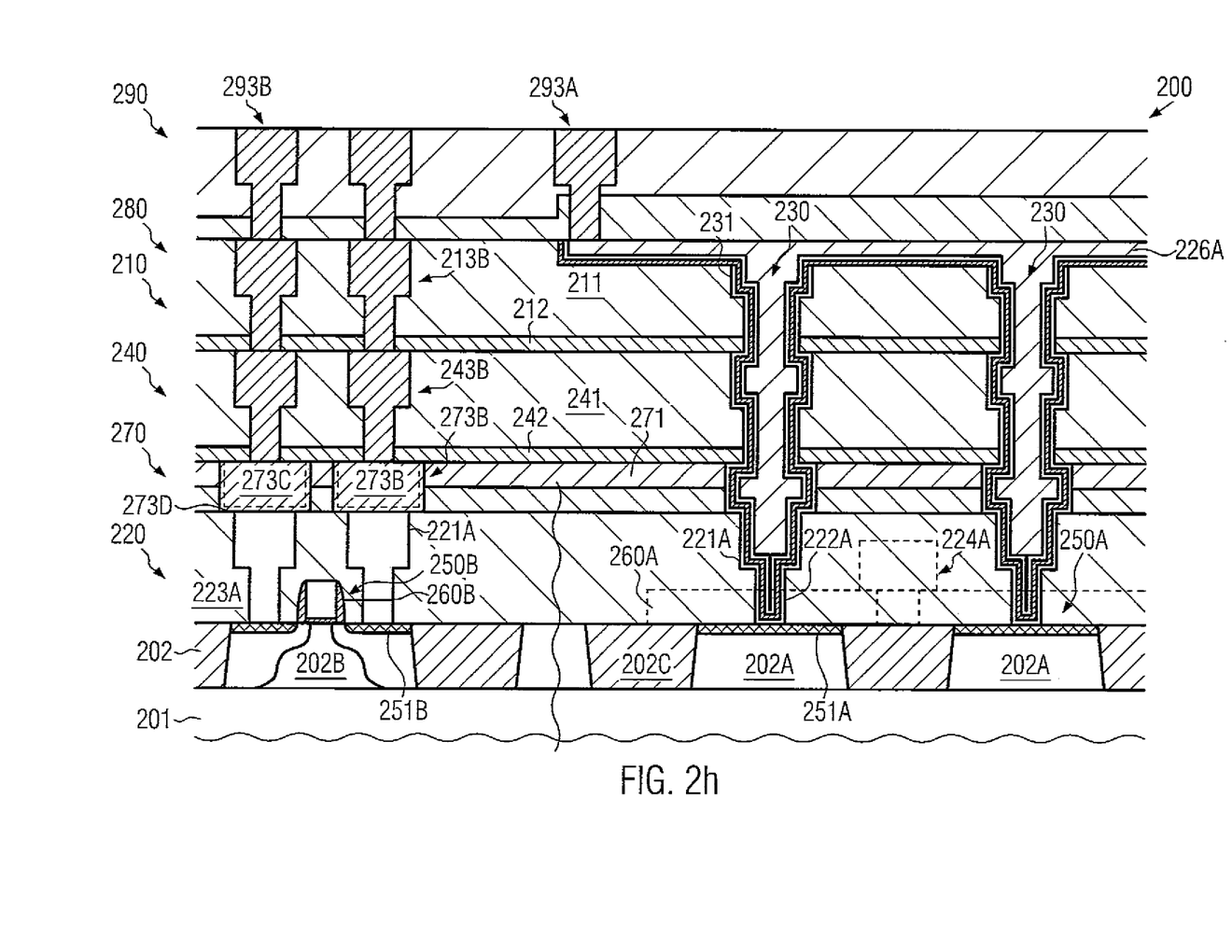

FIG. 2h schematically illustrates the semiconductor device 200 in a further advanced manufacturing stage. As shown, metal regions 293B are formed in the metallization layer 290 so as to connect appropriately to the lower-lying metallization layer 210. Similarly, a metal region 293A is illustrated so as to connect to the common electrode 226A of the capacitive structures 230. The metal regions 293A, 293B may be formed by depositing any appropriate metal, such as copper and the like, in combination with barrier materials, as is also discussed above, and thereafter any excess material may be removed.

As a result, the present disclosure provides capacitive structures in a metallization system, for instance capacitors for a memory array, or capacitive structures for any other purposes such as a decoupling capacitor and the like, wherein high capacitance values are readily achievable by selecting the number of involved metallization layers for given lateral dimensions of the capacitive structure. To this end, the placeholder metal region may be formed so as to extend through a desired number of metallization layers, possibly including the contact level, wherein a replacement process sequence may be applied for removing the metal of the placeholder metal region without unduly affecting any other portions of the metallization system. To this end, a highly efficient wet chemical etch chemistry may be applied. Consequently, a very high aspect ratio of the corresponding capacitor cavities may be implemented without requiring sophisticated plasma enhanced etch techniques. In this manner, high aspect ratio contact elements in the contact level may be avoided, which may result in superior performance of non-memory transistors. The above-described process strategy may be highly efficiently implemented in manufacturing strategies requiring the formation of semiconductor-based circuit elements on the basis of critical dimensions of 40 nm and significantly less.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a metallization system comprising a plurality of metallization layers above a memory area that is formed in and above a semiconductor region of a semiconductor device, each of said plurality of metallization layers comprising a dielectric material and a conductive metal region embedded in said dielectric material, wherein forming said metallization system comprises forming a placeholder metal region continuously extending through said dielectric material of each of said plurality of metallization layers;

after forming said metallization system and said placeholder metal region continuously extending through said dielectric material of each of said plurality of metallization layers, selectively removing conductive material from said placeholder metal region so as to form a capacitor cavity extending continuously through said dielectric material of each of said plurality of metallization layers; and forming a capacitor in said capacitor cavity.

2. The method of claim 1, further comprising, prior to forming said metallization system, forming a contact level above said memory area, wherein said contact level comprises one or more dielectric materials and at least one contact element embedded in said one or more dielectric materials and extending continuously through said contact level so as to contact a contact region formed in said semiconductor region, said metallization system being formed above said contact level.

3. The method of claim 2, wherein forming said capacitor cavity comprises exposing said at least one contact element.

4. The method of claim 2, wherein forming said capacitor cavity further comprises selectively removing conductive material from said at least one contact element so as to expose said contact region, said capacitor cavity extending continuously through each of said plurality of metallization layers and said contact level.

5. The method of claim 1, wherein selectively removing conductive material from said placeholder metal region comprises removing a core metal and a barrier material.

6. The method of claim 1, wherein forming said metallization system comprises forming a portion of said plurality of metallization layers above a non-memory area of said semiconductor device, said non-memory area being formed in and above a second semiconductor region of said semiconductor device, the method further comprising masking said portion of said plurality of metallization layers formed above said non-memory area when selectively removing said conductive material from said placeholder metal region.

7. The method of claim 6, further comprising, prior to forming said metallization system, forming a contact level above said memory area and said non-memory area during a common processing sequence, said metallization system being formed above said contact level, said contact level comprising one or more dielectric materials and at least a first contact element and a second contact element embedded in said one or more dielectric materials and extending continuously through said contact level, wherein said at least said first contact element contacts a first contact region formed in said semiconductor region and said at least said second contact element contacts a second contact region formed in said second semiconductor region.

8. The method of claim 6, further comprising forming a stop layer above said plurality of metallization layers and selectively removing said stop layer from above said memory area.

9. The method of claim 8, wherein forming said capacitor comprises filling said capacitor cavity at least with at least an electrode material and removing an excess portion of said electrode material during a material removal process by using said stop layer for controlling said material removal process.

10. The method of claim 1, wherein forming said capacitor comprises performing a material deposition process to deposit a first electrode material on all sidewall surfaces of said capacitor cavity.

11. The method of claim 10, further comprising forming a dielectric material layer on at least exposed surface areas of said first electrode material formed in said capacitor cavity and forming a second electrode material on at least a portion of said dielectric material layer.

12. The method of claim 11, further comprising removing at least a portion of said second electrode material formed outside of said capacitor cavity so as to form a contact region for connecting to said second electrode material.

13. The method of claim 1, further comprising forming at least one further metallization layer above said memory area after forming said capacitor.

14. The method of claim 1, wherein said placeholder metal region comprises at least a conductive core material, and wherein forming said capacitor cavity comprises removing substantially an entirety of said conductive core material from said placeholder metal region.

15. A method of forming a capacitive structure of a semiconductor device, the method comprising:
  forming a plurality of metallization layers above a first semiconductor region and a second semiconductor region in a common process sequence, each of said plurality of metallization layers comprising a dielectric material and a conductive metal region embedded in said dielectric material, wherein forming said plurality of metallization layers comprises forming a placeholder metal region that is positioned above said first semiconductor region and continuously extends through said dielectric material of each of said plurality of metallization layers;
  after forming said plurality of metallization layers and said placeholder metal region that continuously extends through said dielectric material of each of said plurality of metallization layers, removing material of said placeholder metal region so as to form a cavity extending continuously through said dielectric material of each of said plurality of metallization layers;
  after forming said cavity, replacing said removed material of said placeholder metal region with at least a dielectric material layer and a first electrode material formed above said dielectric material layer; and
  after replacing said removed material, forming at least one further metallization layer above said plurality of metallization layers.

16. The method of claim 15, wherein removing said material of said placeholder metal region comprises performing a wet chemical etch process so as to remove at least a conductive core metal from said placeholder metal region.

17. The method of claim 16, further comprising removing, during said wet chemical etch process, at least a portion of a conductive barrier material that is formed between said conductive core metal and said dielectric material comprising each of said plurality of metallization layer.

18. The method of claim 15, wherein removing said material of said placeholder metal region comprises exposing a conductive contact element formed in a contact level below said plurality of metallization layers, the method further comprising removing material of said conductive contact element so as to expose a contact region formed in said first semiconductor region.

19. The method of claim 18, wherein said material of said placeholder metal region and said material of said conductive contact element are removed during a common etching process.

20. The method of claim 15, wherein said first semiconductor region comprises a memory array of said semiconductor device.

21. The method of claim 15, further comprising replacing said removed material of said placeholder metal region with a second electrode material, said dielectric material layer being formed on said second electrode material.

22. A method, comprising:
  forming a contact level of a semiconductor device above first and second semiconductor regions of said semiconductor device in a common process sequence;
  forming a first dielectric material above said contact level, said first dielectric material extending laterally over said first and second semiconductor regions;
  forming first and second openings in said first dielectric material during a common process sequence, said first and second openings being positioned above said first and second semiconductor regions, respectively;
  forming a first contact element in said first opening and a first portion of a placeholder metal region in said second opening during a common process sequence, said first contact element and said first portion comprising a common conductive core material;
  forming a second dielectric material above said first dielectric material, said second dielectric material extending laterally over said first and second semiconductor regions;
  forming third and fourth openings in said second dielectric material during a common process sequence, said third and fourth openings exposing said first contact element and said first portion of said placeholder metal region, respectively;
  forming a second contact element in said third opening and a second portion of a placeholder metal region in said fourth opening during a common process sequence, wherein said second contact element directly contacts said first contact element and said second portion directly contacts said first portion, said second contact element and said second portion comprising said common conductive core material;
  after forming said first and second portions of said placeholder metal region in said first and second dielectric materials, forming a capacitor cavity in at least said first and second dielectric layers by selectively removing substantially an entirety of said conductive core material from at least said first and second portions of said placeholder metal region during a common material removal process; and
  forming a capacitor in said capacitor cavity.

* * * * *